(12) United States Patent
Huang et al.

(10) Patent No.: US 10,608,144 B2
(45) Date of Patent: Mar. 31, 2020

(54) ELECTRODE PAD STRUCTURE OF A LIGHT EMITTING DIODE

(71) Applicant: Genesis Photonics Inc., Tainan (TW)

(72) Inventors: Yi-Ru Huang, Tainan (TW); Tung-Lin Chuang, Tainan (TW); Chih-Ming Shen, Tainan (TW); Sheng-Tsung Hsu, Tainan (TW); Kuan-Chieh Huang, New Taipei (TW); Jing-En Huang, Tainan (TW); Shao-Ying Ting, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/975,743

(22) Filed: May 9, 2018

(65) Prior Publication Data

US 2018/0261729 A1     Sep. 13, 2018

Related U.S. Application Data

(63) Continuation of application No. 15/045,266, filed on Feb. 17, 2016, now abandoned.

(Continued)

(51) Int. Cl.
*H01L 33/00* (2010.01)
*H01L 33/46* (2010.01)
(Continued)

(52) U.S. Cl.
CPC .............. *H01L 33/46* (2013.01); *H01L 33/10* (2013.01); *H01L 33/44* (2013.01); *H01L 33/50* (2013.01);
(Continued)

(58) Field of Classification Search
CPC ......... H01L 33/46; H01L 33/36; H01L 33/10; H01L 33/40; H01L 33/44; H01L 33/50; H01L 33/62
See application file for complete search history.

(56) References Cited

U.S. PATENT DOCUMENTS

2005/0104220 A1*   5/2005   Tsuchiya ................. H01L 24/81
                                                                     257/774
2006/0231852 A1*   10/2006   Kususe ................... H01L 24/06
                                                                      257/99

(Continued)

OTHER PUBLICATIONS

"Office Action of China Related Application, application No. 201610089450.1", dated Dec. 4, 2018, p. 1-p. 6.
(Continued)

*Primary Examiner* — Minh Loan Tran
(74) *Attorney, Agent, or Firm* — JCIPRNET (57) ABSTRACT

Provided is a light emitting diode (LED) mounted on a carrier substrate and including a semiconductor epitaxial structure and at least one electrode pad structure. The semiconductor epitaxial structure is electrically connected to the carrier substrate. The electrode pad structure includes a eutectic layer, a barrier layer and a ductility layer. The eutectic layer is adapted for eutectic bonding to the carrier substrate. The barrier layer is between the eutectic layer and the semiconductor epitaxial structure. The barrier layer blocks the diffusion of the material of the eutectic layer in the eutectic bonding process. The ductility layer is between the eutectic layer and the semiconductor epitaxial structure. The ductility layer reduces the stress on the LED produced by thermal expansion and contraction of the substrate during the eutectic bonding process, so as to prevent the electrode pad structure from cracking, and maintain the quality of the LED.

20 Claims, 7 Drawing Sheets

Related U.S. Application Data (60) Provisional application No. 62/116,923, filed on Feb. 17, 2015, provisional application No. 62/148,761, filed on Apr. 17, 2015.

(51) Int. Cl.
*H01L 33/50* (2010.01)
*H01L 33/44* (2010.01)
*H01L 33/10* (2010.01)
*H01L 33/62* (2010.01)
*H01L 33/40* (2010.01)
*H01L 33/36* (2010.01)

(52) U.S. Cl.
CPC .............. *H01L 33/62* (2013.01); *H01L 33/36* (2013.01); *H01L 33/40* (2013.01); *H01L 2224/16225* (2013.01); *H01L 2224/32225* (2013.01); *H01L 2224/48091* (2013.01); *H01L 2224/48227* (2013.01); *H01L 2224/48465* (2013.01); *H01L 2224/73265* (2013.01); *H01L 2933/0025* (2013.01)

(56) References Cited

U.S. PATENT DOCUMENTS

| | | |
|---|---|---|
| 2011/0291141 A1 | 12/2011 | Sorimachi |
| 2011/0297986 A1 | 12/2011 | Nishiuchi et al. |
| 2013/0279311 A1* | 10/2013 | Hurley ................ B23K 1/0008 369/13.02 |
| 2013/0320382 A1 | 12/2013 | Kojima et al. |

OTHER PUBLICATIONS

"Office Action of U.S. Related Application, U.S. Appl. No. 16/102,691", dated Dec. 4, 2019, p. 1-p. 12.

\* cited by examiner

ELECTRODE PAD STRUCTURE OF A LIGHT EMITTING DIODE

CROSS-REFERENCE TO RELATED APPLICATION

The application is a continuation application of and claims the priority benefit of U.S. application Ser. No. 15/045,266, filed on Feb. 17, 2016, now pending, which claims the priority benefits of U.S. provisional application Ser. No. 62/116,923, filed on Feb. 17, 2015 and U.S. provisional application Ser. No. 62/148,761, filed on Apr. 17, 2015. The entirety of each of the above-mentioned patent applications is hereby incorporated by reference herein and made a part of this specification.

BACKGROUND OF THE INVENTION

1. Field of the Invention

The present invention is related to a light emitting diode (LED).

2. Description of Related Art

A light emitting diode emits light by the recombination of electrons and holes therein when a current is applied to the semiconductor material thereof. As compared with a traditional light source, a light emitting diode has advantages of low power consumption, environment friendly, long service life and fast reaction speed, so the light emitting diode has been widely applied to the lighting field and the display field.

Generally speaking, the common bonding technologies for light emitting diodes include wire bonding (W/B) and flip chip (F/C). The flip chip bonding technology is known for its characteristics of reducing the size of chip package and reducing the path for signal transmission, and thus, the technology has been broadly applied in the package of a light emitting diode. The flip chip bonding technology includes a direct bonding in which the metal pads of a light emitting diode is aligned with the conductive bumps of a substrate, and the light emitting diode and the substrate are heated in a reflow oven to achieve eutectic bonding and electrical connection between the light emitting diode and the circuit of the substrate. However, during the eutectic bonding, the substrate is subjected to thermal expansion and contraction in the heating process, so stress is generated in the light emitting diode, and therefore cracks are formed in the metal pads. Such cracks would easily lead to a current leakage, so the quality of the light emitting diode is reduced.

SUMMARY OF THE INVENTION

The present invention provides a light emitting diode with the desired quality.

A light emitting diode of the present invention is mounted on a carrier substrate and includes a semiconductor epitaxial structure and at least one electrode pad structure. The semiconductor epitaxial structure is electrically connected to the carrier substrate through the at least one electrode pad structure. The electrode pad structure includes a eutectic layer, a barrier layer and a ductility layer. The eutectic layer is adapted for eutectic bonding to the carrier substrate. The barrier layer is disposed between the eutectic layer and the semiconductor epitaxial structure. The barrier layer blocks the diffusion of the material of the eutectic layer in the eutectic bonding process. The ductility layer is disposed between the eutectic layer and the semiconductor epitaxial structure and may have a stack of at least one metal material. The ductility layer reduces the stress on the light emitting diode produced by thermal expansion and contraction of the substrate during the heating phase in the eutectic bonding process, so as to prevent the electrode pad structure from cracking, and maintain the quality of the light emitting diode.

In an embodiment of the present invention, the eutectic layer includes at least one material selected from the group consisting of Au, Au/Sn and Sn/Ag/Cu.

In an embodiment of the present invention, the barrier layer includes at least one material selected from the group consisting of Ni, Ti and Pt.

In an embodiment of the present invention, the ductility layer includes at least one material selected from the group consisting of Au, Ag, Al, Ni, Ti, Cr and Pt.

In an embodiment of the present invention, the light emitting diode further includes an adhesive layer disposed between the ductility layer and the semiconductor epitaxial structure.

In an embodiment of the present invention, the adhesive layer includes at least one material selected from the group consisting of Ni, Ti, Cr and Pt.

In an embodiment of the present invention, the semiconductor epitaxial structure includes a first-type semiconductor layer, a second-type semiconductor layer and a light emitting layer disposed between the first-type semiconductor layer and the second-type semiconductor layer.

In an embodiment of the present invention, one of the first-type semiconductor layer and the second-type semiconductor layer is a P-type semiconductor layer, and the other of the first-type semiconductor layer and the second-type semiconductor layer is an N-type semiconductor layer.

In an embodiment of the present invention, the at least one electrode pad structure includes a first electrode pad structure and a second electrode pad structure separated from each other. The first-type semiconductor layer is electrically connected to the carrier substrate through the first electrode pad structure. The second-type semiconductor layer is electrically connected to the carrier substrate through the second electrode pad structure.

In an embodiment of the present invention, the light emitting diode further includes a growth substrate. The semiconductor epitaxial structure is formed on the growth substrate and between the growth substrate and a plurality of electrode pad structures.

In an embodiment of the present invention, one of the first-type semiconductor layer and the second-type semiconductor layer is electrically connected to carrier substrate through the electrode pad structure. The other of the first-type semiconductor layer and the second-type semiconductor layer is electrically connected to the carrier substrate through a wiring.

A light emitting diode of the present invention is mounted on a carrier substrate and includes a semiconductor epitaxial structure and at least one electrode pad structure. The semiconductor epitaxial structure is electrically connected to the carrier substrate through the at least one electrode pad structure. The at least one pad structure includes a eutectic layer and a ductility layer. The eutectic layer is adapted for eutectic bonding to the carrier substrate. The ductility layer is disposed between the eutectic layer and the semiconductor epitaxial structure. A material of the ductility layer is different from a material of the eutectic layer, and a thickness of the ductility layer is greater than 300 nm.

In view of the above, in the light emitting diode according to an embodiment of the present invention, a ductility layer is disposed between a eutectic layer and a semiconductor epitaxial structure. The ductility layer can have a stack of at least one metal material so as to relax the stress generated in the process of bonding the light emitting diode to a substrate. Therefore, cracks caused by thermal expansion and contraction of the substrate are unlikely to occur inside the light emitting diode according to an embodiment of the present invention.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
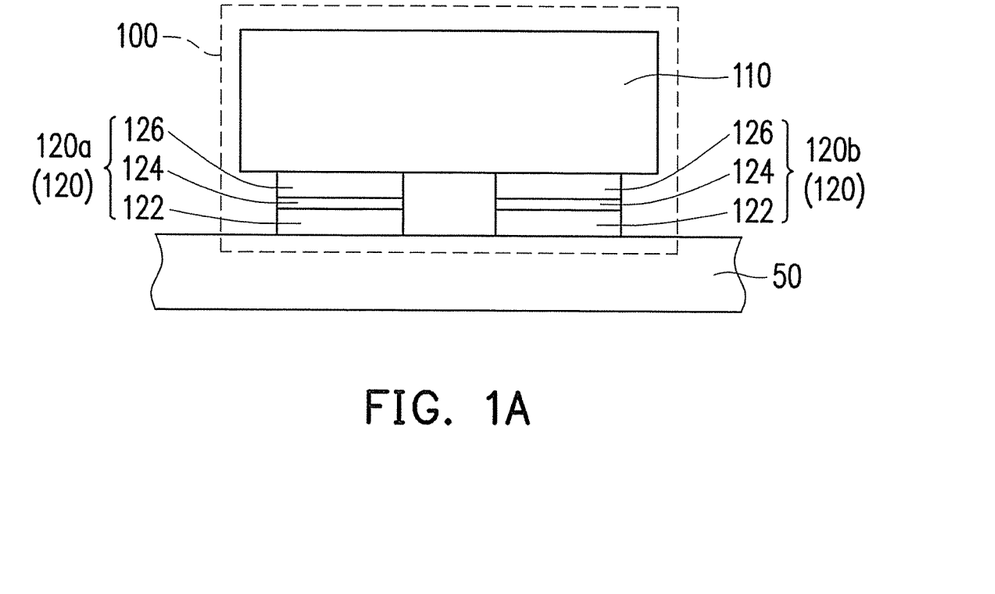
FIG. 1A is a schematic view of a light emitting diode mounted on a carrier substrate according to an embodiment of the present invention.

FIG. 1A is a schematic view of a light emitting diode mounted on a carrier substrate according to an embodiment of the present invention. Referring to FIG. 1A, a light emitting diode 100 includes a semiconductor epitaxial structure 110 and a plurality of electrode pad structures 120, and the light emitting diode 100 is mounted on a carrier substrate 50 through the electrode pad structures 120. The material of the semiconductor epitaxial structure 110 can be GaN, InGaN or another electroluminescent semiconductor material. However, the material of the semiconductor epitaxial structure 110 is not limited by the present invention. In this embodiment, the electrode pad structures 120 include a first electrode pad structure 120a and a second electrode pad structure 120b separated from each other. The first electrode pad structure 120a and the second electrode pad structure 120b have the same structure. The semiconductor epitaxial structure 110 is electrically connected to the carrier substrate 50 through both of the first electrode pad structure 120a and the second electrode pad structure 120b. Specifically, the first electrode pad structure 120a and the second electrode pad structure 120b can be connected to a semiconductor layer of the same conductivity type of the semiconductor epitaxial structure 110, or connected to semiconductor layers of different conductivity types of the semiconductor epitaxial structure 110.

The carrier substrate 50 can be a circuit board or a conductive substrate, and circuit contacts (not shown) are disposed on the carrier substrate 50 and correspond to the electrode pad structures 120 (e.g., first and second electrode pad structures 120a and 120b). After the light emitting diode 100 is mounted on the carrier substrate 50 through the electrode pad structures 120, the semiconductor epitaxial structure 110 can be driven to emit light in response to the current from the circuit contacts. In some embodiments, the number of the electrode pad structures 120 can be adjusted according the design of the semiconductor epitaxial structure and the circuit design on the carrier substrate 50. The number of the electrode pad structures 120 is not limited by the present invention. That is to say, the number of the electrode pad structures 120 can be only one or more than two.

Each of the electrode pad structures 120 is a multi-layer structure and includes a eutectic layer 122, a barrier layer 124 and a ductility layer 126. The barrier layer 124 is disposed between the eutectic layer 122 and the semiconductor epitaxial structure 110, and the ductility layer 126 is disposed between the barrier layer 124 and the semiconductor epitaxial structure 110. In this embodiment, the method of forming the first and second electrode pad structures 120a and 120b includes forming a composite material layer having ductility layer 126, a barrier layer 124 and a eutectic layer 122 on the semiconductor epitaxial structure 110, and patterning the composite material layer to form the first electrode pad structure 120a and the second electrode pad structure 120b separated from each other. Therefore, the first electrode pad structure 120a and the second electrode pad structure 120b have the same laminated structure.

The eutectic layer 122 is adapted for eutectic bonding to the carrier substrate 50. For example, in the flip-chip process for mounting the light emitting diode 100 on the carrier substrate 50, the eutectic layer 122 is heated to a eutectic point (e.g., 285° C.) and therefore bonded to the circuit contacts (not shown) of the carrier substrate 50. Specifically, the material of the eutectic layer 122 includes at least one material selected from the group consisting of Au, Au/Sn and Sn/Ag/Cu, and such material facilitates the eutectic layer 122 to reach the eutectic point easily and enables the bonding of the eutectic layer 122 to the carrier substrate 50 in the heating process.

Figure 1B:
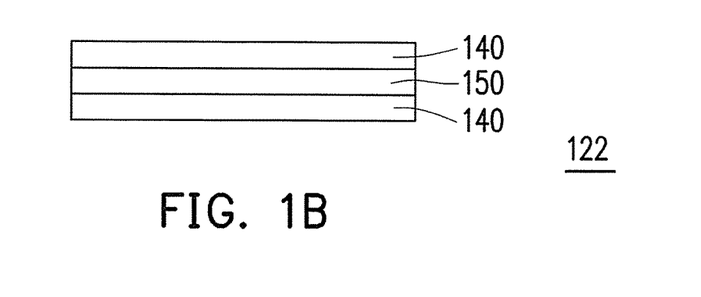
FIG. 1B is an embodiment of a eutectic layer of the light emitting diode in FIG. 1A.
Figure 1C:
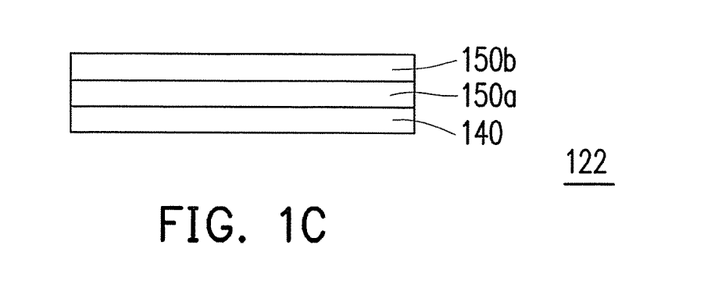
FIG. 1C is another embodiment of a eutectic layer of the light emitting diode in FIG. 1A.

FIG. 1B is an embodiment of a eutectic layer of the light emitting diode in FIG. 1A. FIG. 1C is another embodiment of a eutectic layer of the light emitting diode in FIG. 1A. Referring to FIG. 1B, in this embodiment, the eutectic layer 122 can further include at least one alloy layer 140 and at least one material layer 150. For example, one material layer 150 is located between two adjacent alloy layers 140. Besides, referring to FIG. 1C, in this embodiment, the material layer includes at least one first material layer 150a and at least one second material layer 150b stacked and located on the at least one alloy layer 140. Specifically, the material of the alloy layer 140 includes at least one alloy selected from the group consisting of Au/Sn or Sn/Ag/Cu. Besides, in the embodiment of FIG. 1B, the material of the material layer 150 includes at least one material selected from the group consisting of Au, Sn, Al, Ni, Ti and Pt. In the embodiment of FIG. 1C, the material of the first material layer 150a includes at least one material selected from the group consisting of Au, Sn, Al, Ni, Ti and Pt. The material of the second material layer 150b includes at least one material selected from the group consisting of Au, Sn, Al, Ni, Ti and Pt. Besides, at least in the embodiments of FIG. 1B and FIG. 1C, the material layer 150 at least contains a material included in the alloy layer 140. Continue referring to FIG. 1A, in addition to the above-mentioned materials, another material suitable for eutectic boning to the carrier substrate 50 through heating can be selected for the eutectic layer 122. In other words, the material of the eutectic layer 122 is not limited by the present invention.

The barrier layer 124 is configured to block the diffusion of the material of the eutectic layer 122 during the eutectic bonding. For example, the barrier layer 124 can block the material of the eutectic layer 122 from diffusing into the semiconductor epitaxial structure 110, so as to prevent the semiconductor epitaxial structure 110 from being contaminated by the eutectic layer 122 during the eutectic bonding. Generally speaking, the material of the barrier layer 124 includes at least one material selected from the group consisting of Au, Al, Ni, Ti and Pt or a stack thereof, so the barrier layer 124 can provide good barrier effect even when the process temperature reaches the eutectic temperature of the eutectic layer 122. In addition to the above-mentioned materials, another material suitable for blocking the diffusion of the eutectic layer 122 can be selected for the barrier layer 124. Specifically, the material selected for the barrier layer 124 is adjusted depending on the material selected for the eutectic layer 122. In other words, the material of the eutectic layer 122 and the material of barrier layer 124 are not limited by the present invention.

In this embodiment, the ductility layer 126 is disposed between the barrier layer 124 and the semiconductor epitaxial structure 110. The ductility layer 126 can have a stack of at least one metal material. The ductility layer is configured to reduce the stress generated to the light emitting diode caused by thermal expansion and contraction in the eutectic bonding during the substrate heating process, so as to prevent cracks from occurring in the metal pads and therefore maintain the quality of the light emitting diode. Specifically, the material of the ductility layer 126 includes at least one material selected from the group consisting of Au, Al, Ni, Ti, Cr and Pt. In addition to the above-mentioned materials, a combination of a stack or a part of a periodic stack having at least one material selected from the group consisting of Au, Al, Ni, Ti and Pt can be selected for the ductility layer 126. Besides, in some embodiments, the barrier layer 124 or the ductility layer 126 can consist of 80 wt % of Au and 20 wt % of Sn, but the present invention is not limited thereto.

Generally speaking, the coefficient of thermal expansion (CTE) of the light emitting diode 100 is different from the CTE of the carrier substrate 50. When the light emitting diode 100 is eutectic bonded to the carrier substrate 50, the increased volume for the carrier substrate 50 is greater than the increased volume for the light emitting diode 100 in the heating process, so the carrier substrate 50 is deformed more seriously than the light emitting diode 100. Therefore, the electrode pad structures 120 of the light emitting diode 100 are subjected to the stress generated by thermal expansion and contraction of the carrier substrate 50. When such stress is too high, cracks are easily generated in the electrode pad structures 120, and a leakage current may occur in the light emitting diode 100.

In this embodiment, each of the electrode pad structures 120 of the light emitting diode 100 includes a ductility layer 126, and the ductility layer 126 can have a stack of at least one metal material. Therefore, the ductility layer 126 can relax the stress generated by thermal expansion and contraction of the carrier substrate 50, thereby prevent cracks from being generated in the electrode pad structures 120. Specifically, in this embodiment, cracks caused by thermal expansion and contraction of the carrier substrate 50 are unlikely to occur inside the light emitting diode 100.

Figure 2:
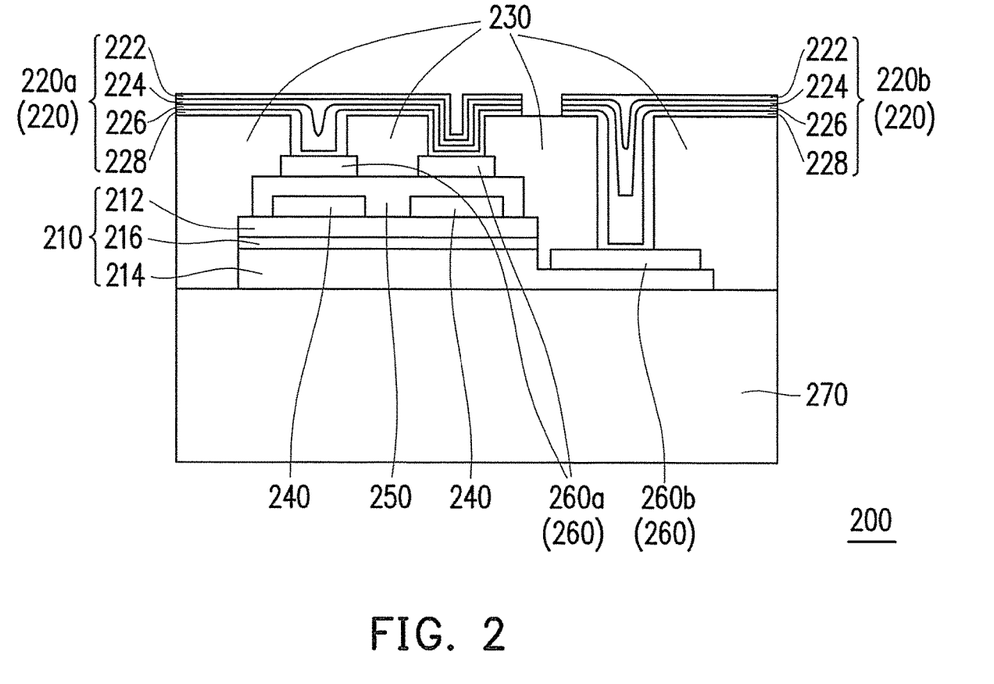
FIG. 2 is schematic view of a light emitting diode according to another embodiment of the present invention.

FIG. 2 is schematic view of a light emitting diode according to another embodiment of the present invention. Referring to FIG. 2, a light emitting diode 200 includes a semiconductor epitaxial structure 210 and a plurality of electrode pad structures 220, and the electrode pad structures 220 include a first electrode pad structure 220a and a second electrode pad structure 220b separated from each other. Besides, the light emitting diode 200 can further include an insulating layer 230, a current blocking layer 240, a transparent conductive layer 250, a metal electrode layer 260 and a growth substrate 270.

Specifically, the semiconductor epitaxial structure 210 includes a first-type semiconductor layer 212, a second-type semiconductor layer 214 and a light emitting layer 216. The light emitting layer 216 is disposed between the first-type semiconductor layer 212 and the second-type semiconductor layer 214. Specifically, one of the first-type semiconductor layer 212 and the second-type semiconductor layer 214 is a P-type semiconductor layer, and the other of the first-type semiconductor layer 212 and the second-type semiconductor layer 214 is an N-type semiconductor layer. That is to say, the first-type semiconductor layer 212 and the second-type semiconductor layer 214 are two semiconductor layers of different dopant types. In some embodiments, the light emitting layer 216 includes a quantum well (QW) structure or a multiple quantum well (MQW) structure. Besides, the semiconductor epitaxial structure 210 can replace the semiconductor epitaxial structure 110 in FIG. 1A.

In this embodiment, the semiconductor epitaxial structure 210 is formed on the growth substrate 270. The material of the growth substrate 270 includes sapphire. However, in some embodiments, the material of the growth substrate 270 can include SiC, Si or another substrate adapted for semiconductor epitaxy. Besides, a laser ablation or another physical or chemical method can be performed to remove the growth substrate 270 from the light emitting diode 200.

After the semiconductor epitaxial structure 210 is formed on the growth substrate 270, a current blocking layer 240, a transparent conductive layer 250 and a metal electrode layer 260 are sequentially formed on the semiconductor epitaxial structure 210, followed by the formation of an insulating layer 230 and an electrode pad structure 220. The insulating layer 230 at least covers the semiconductor epitaxial structure 210 and has a plurality of contact openings therein, so the electrode pad structures 220 are electrically connected to the semiconductor epitaxial structure 210 through the contact openings.

The current blocking layer 240 is disposed on the first-type semiconductor layer 212, and the transparent conductive layer 250 is disposed on the first-type semiconductor layer 212 and covers the current blocking layer 240. The material of the current blocking layer 240 can include silicon dioxide ($SiO_2$) or another material suitable for blocking the current. The current blocking layer 240 has specific patterns that expose a portion of the area of the first-type semiconductor layer 212, and the transparent conductive layer 250 is in contact with the portion of the area of the first-type semiconductor layer 212 exposed by the current blocking layer 240. Therefore, the transparent conductive layer 250 can be electrically connected to the first-type semiconductor layer 212. The transparent conductive layer 250 is configured to uniformly disperse the current in the semiconductor epitaxial structure 210, provide a greater light emitting region of the light emitting layer 216, and exhibit an improved light emitting uniformity. The material of the transparent conductive layer 250 can include indium tin oxide (ITO) or another material suitable for current dispersion.

The metal electrode layer 260 includes a first metal electrode layer 260a that is electrically connected to the first-type semiconductor layer 212 and a second metal electrode layer 260b that is electrically connected to the second-type semiconductor layer 214. The first metal electrode layer 260a is in contact with the transparent conductive layer 250, and the area of the current blocking layer 240 corresponds to the area of the first metal electrode layer 260a. Accordingly, the current blocking layer 240 is configured to adjust the current flowing direction and reduce the current flowing in the region shielded by the first metal electrode layer 260a, which is beneficial to enhance the light emitting efficiency of the light emitting diode 200. The material of the metal electrode layer 260 (e.g., first metal electrode layer 260a, second metal electrode layer 260b) can include a combination of a stack or a part of a periodic stack having at least one material selected from the group consisting of Au, Al, Ni, Ti, Cr and Pt, or another material with good electric conductivity. The material of the metal electrode layer 260 (e.g., first metal electrode layer 260a, second metal electrode layer 260b) can further include Ni or Ti, which is for blocking the diffusion of the material (e.g., Sn or Au) of the eutectic layer and therefore preventing crack generation of the metal pads during the eutectic bonding process. Therefore, the quality of the light emitting diode is maintained.

Besides, the insulating layer 230 can include a distributed Bragg reflector (DBR) structure. The DBR structure is a periodic structure including two different refractive materials alternately arranged, a part of a periodic structure, a graded layer with increasing refraction index or a graded layer with decreasing refraction index. That is to say, in the DBR structure, at least one of the adjacent layers is associated with the respective thicknesses, materials and reflection wavelength ranges thereof. Specifically, the DBR structure can reflect the light emitted by the semiconductor epitaxial structure 210. However, in some embodiments, the insulating layer 230 can include another different structure feature as long as this structure feature provides the required insulating property. In other words, the material and the structure feature of the insulating layer 230 are not limited by the present invention.

In this embodiment, the semiconductor epitaxial structure 210 has a horizontal-type structure. The electrode pad structures 220 include a first electrode pad structure 220a that is connected to the first metal electrode layer 260a and a second electrode pad structure 220b that is connected to the second metal electrode layer 260b, and the first electrode pad structure 220a and the second electrode pad structure 220b are both connected to the same side of the semiconductor epitaxial structure 210. In the meantime, the first electrode pad structure 220a is electrically connected to the first-type semiconductor layer 212 through the connection to the first metal electrode layer 260a and the transparent conductive layer 250, and the second electrode pad structure 220b is electrically connected to the second-type semiconductor layer 214 through the connection to the second metal electrode layer 260b.

Each of the electrode pad structures 220 (e.g., first electrode pad structure 220a or second electrode pad structure 220b) includes a eutectic layer 222, a barrier layer 224, a ductility layer 226 and an adhesive layer 228. The eutectic layer 222, the barrier layer 224 and the ductility layer 226 can be the same as the eutectic layer 122, the barrier layer 124 and the ductility layer 126 in FIG. 1A. The adhesive layer 228 is disposed between the ductility layer 226 and the semiconductor epitaxial structure 210, for ensuring the connection between each electrode pad structure 220 and the light emitting diode 200. Specifically, the material of the adhesive layer 228 includes at least one material selected from the group consisting of Ni, Ti, Cr and Pt.

In this embodiment, both of the first electrode pad structure 220a and the second electrode pad structure 220b are configured to be bonded to the external carrier substrate (e.g., carrier substrate 50 in FIG. 1A). When the electrode pad structures 220 and the carrier substrate are eutectic bonded to each other, the disposition of the ductility layer 226 helps to relax the stress caused by thermal expansion and contraction of the carrier substrate, so as to prevent cracks from being generated in the electrode pad structures 220. Specifically, in this embodiment, the quality of the light emitting diode 200 is improved since the stress caused by thermal expansion and contraction of the carrier substrate is unlikely to occur.

Figure 3:
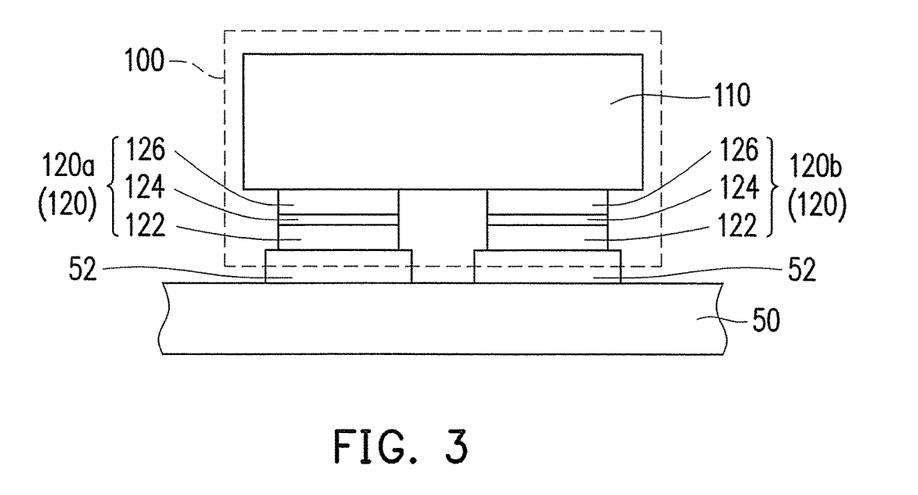
FIG. 3 is a schematic view of a light emitting diode eutectic bonded to a carrier substrate according to yet another embodiment of the present invention.

FIG. 3 is a schematic view of a light emitting diode eutectic bonded to a carrier substrate according to yet another embodiment of the present invention. Referring to FIG. 3, the light emitting diode of this embodiment can be the light emitting diode 100 in FIG. 1A, and elements and functions thereof can refer to the associated description of the light emitting diode 100 in FIG. 1A, so the details are not iterated herein. Besides, the light emitting diode 100 can be replaced with the light emitting diode 200. In this embodiment, the light emitting diode 100 is mounted on a carrier substrate 50 through a connecting element 52, and the material of the connecting element 52 includes at least one material selected from the group consisting of Au, Sn, Au/Sn and Sn/Ag/Cu.

Figure 4:
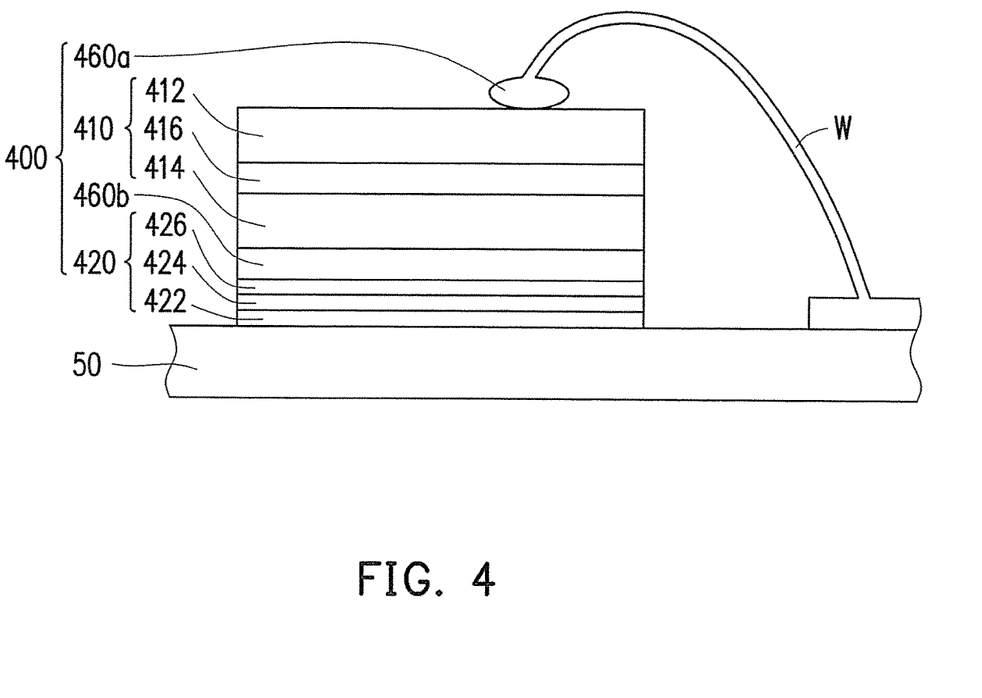
FIG. 4 is a schematic view of a light emitting diode mounted on a carrier substrate according to still another embodiment of the present invention.

FIG. 4 is a schematic view of a light emitting diode mounted on a carrier substrate according to still another embodiment of the present invention. Referring to FIG. 4, the difference between a light emitting diode 400 and the light emitting diode 100 lies in that, the light emitting diode 400 has a vertical-type structure while the light emitting diode 100 has a horizontal-type structure. Specifically, the light emitting diode 400 mounted on a carrier substrate 50 includes a semiconductor epitaxial structure 410, an electrode pad structure 420, a first metal electrode layer 460a, a second metal electrode layer 460b and a wiring W. The semiconductor epitaxial structure 410 includes a first-type semiconductor layer 412, a second-type semiconductor layer 414, and a light emitting layer 416 between the first-type semiconductor layer 412 and the second-type semiconductor layer 414. The first metal electrode layer 460a is electrically connected to the first-type semiconductor layer 412, and the second metal electrode layer 460b is electrically connected to the second-type semiconductor layer 414. The first metal electrode layer 460a is electrically connected to the carrier substrate 50 through the wiring W. The second metal electrode layer 460b is electrically connected to the carrier substrate 50 through the electrode pad structure 420.

In this embodiment, the electrode pad structure 420 is a multi-layer structure and includes a eutectic layer 422, a-barrier layer 424 and a ductility layer 426. The barrier layer 424 is disposed between the eutectic layer 422 and the semiconductor epitaxial structure 410, and the ductility layer 426 is disposed between the barrier layer 424 and the semiconductor epitaxial structure 410. The materials and physical properties of the eutectic layer 422, the barrier layer 424 and the ductility layer 426 can refer to the materials and physical properties of the eutectic layer 122, the barrier layer 124 and the ductility layer 126 in FIG. 1A. That is to say, the electrode pad structure 420 with a multi-layer structure design is beneficial to lower the possibility of generating cracks in the electrode pad structure 420 due to the process temperature change in the bonding step, and thereby increase the quality of the light emitting diode 400.

Figure 5:
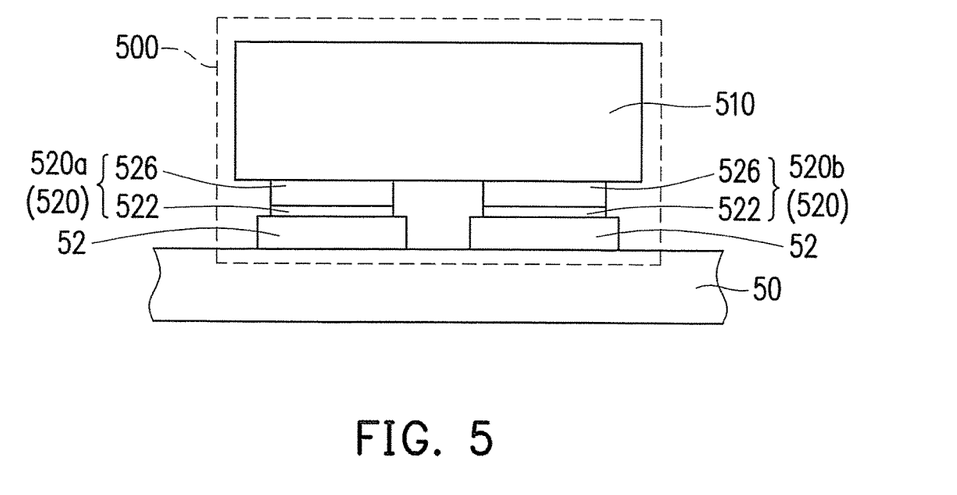
FIG. 5 is a schematic view of a light emitting diode mounted on a carrier substrate according to another embodiment of the present invention.

FIG. 5 is a schematic view of a light emitting diode mounted on a carrier substrate according to another embodiment of the present invention. Referring to FIG. 5, in this embodiment, a light emitting diode 500 includes a semiconductor epitaxial structure 510 and an electrode pad structures 520, wherein the electrode pad structures 520 can include a first electrode pad structure 520a and a second electrode pad structure 520b separated from each other. The semiconductor epitaxial structure 510 can be similar to the semiconductor epitaxial structure 210 in FIG. 2, and at least includes a first-type semiconductor layer, a second-type semiconductor layer and a light emitting layer, wherein the first electrode pad structure 520a and the second electrode pad structure 520b are electrically connected to the first-type semiconductor layer and the second-type semiconductor layer, respectively.

In this embodiment, each of the first electrode pad structure 520a and the second electrode pad structure 520b has a multi-layer structure including a eutectic layer 522 and a ductility layer 526, wherein the ductility layer 526 is disposed between the eutectic layer 522 and the semiconductor epitaxial structure 510. Besides, the material of the ductility layer 526 is different from the material of the eutectic layer 522, and the thickness of the ductility layer 526 is greater than 300 nm. In other words, the main difference between the light emitting diode 500 and the light emitting diode 100 lies in that, each electrode pad structure 520 of the light emitting diode 500 does not include the barrier layer in FIG. 1A.

For example, the material of the ductility layer 526 can be Au, Al, Ni or Ti, and the material of the eutectic layer 522 can be Au/Sn. For example, the material of the ductility layer 526 can be Au, Al, Ni or Ti, and the material of the eutectic layer 522 can be Sn/Ag/Cu. Besides, the light emitting diode 500 can be eutectic bonded to a carrier substrate 50 with the method described in the embodiment of FIG. 3. In this embodiment, when the light emitting diode 500 is eutectic bonded to the carrier substrate 50, the ductility layer 526 can relax the stress caused by thermal expansion and contraction of the carrier substrate 50, so as to prevent cracks from being generated in the electrode pad structures 520. Accordingly, the quality of the light emitting diode 500 can be enhanced. Herein, the design of the electrode pad structures 520 is not limited by the present invention. That is, each of the electrode pad structures 520 is designed to have the eutectic layer 522 and ductility layer 526, but are not limited to these only. In another embodiment, in addition to the eutectic layer 522 and the ductility layer 526, each of the electrode pad structures 520 can further have an adhesive layer 228 (as shown in FIG. 2) between the semiconductor epitaxial structure 510 and the ductility layer 526. Besides, the electrode pad structures 520 of this embodiment can be applied to the light emitting diode 400 in FIG. 4, and replace the electrode pad structure 420 of the light emitting diode 400.

Figure 6A:
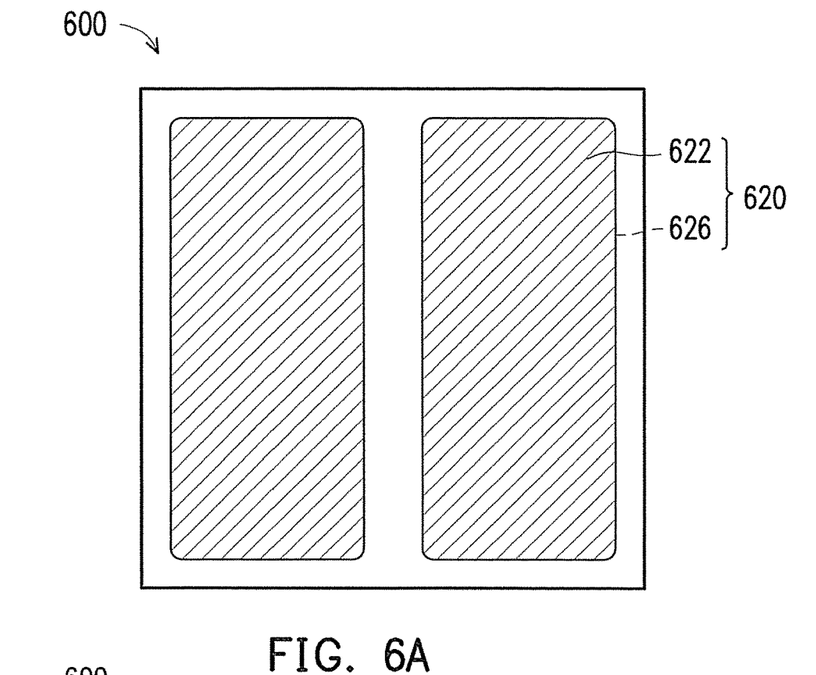
FIG. 6A is a schematic top view of an electrode pad structure of a light emitting diode according to an embodiment of the present invention.
Figure 6B:
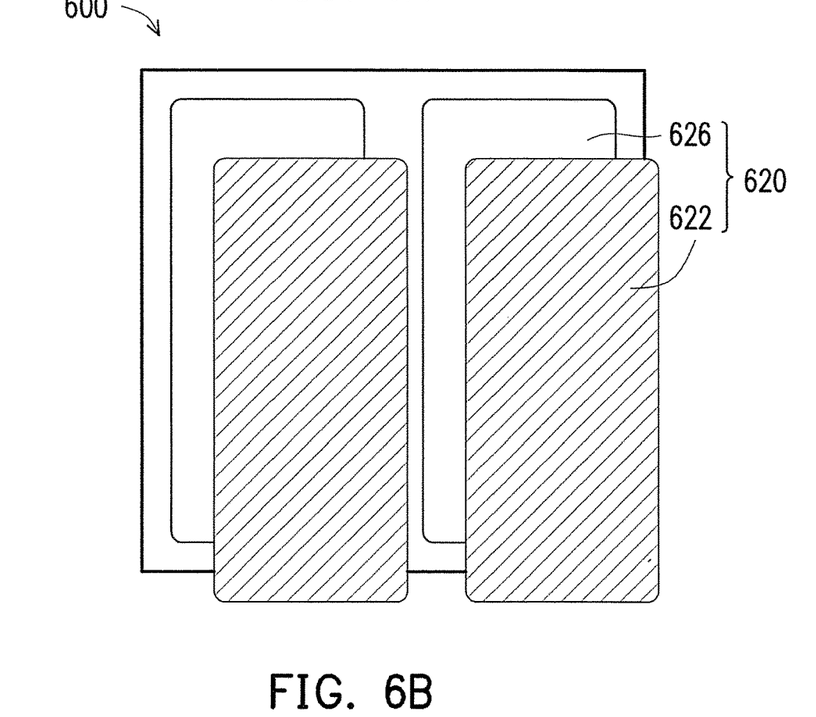
FIG. 6B is a schematic exploded view of a ductility layer and a eutectic layer of the electrode pad structure in FIG. 6A.

FIG. 6A is a schematic top view of an electrode pad structure of a light emitting diode according to an embodiment of the present invention. FIG. 6B is a schematic exploded view of a ductility layer and a eutectic layer of the electrode pad structure in FIG. 6A. Referring to FIG. 6A and FIG. 6B, in this embodiment, a light emitting diode 600 can be the light emitting diode 100 in FIG. 1A, the light emitting diode 200 in FIG. 2 or the light emitting diode 500 in FIG. 5, and elements and functions thereof can refer to the associated description of the mentioned light emitting diode, so the details are not iterated herein. Besides, the carrier substrate 50 is not shown in FIG. 6A and FIG. 6B. In this embodiment, the light emitting diode 600 has two electrode pad structures 620. The total surface area of the electrode pad structures 620 is less than the surface area of the light emitting diode 600. Besides, the area of the ductility layer 626 is the same as the area of the eutectic layer 622 of each electrode pad structure 620, and the shape of the ductility layer 626 corresponds to the shape of the eutectic layer 622 of each electrode pad structure 620. However, the present invention is not limited thereto. Specifically, one electrode pad structure 620 and another electrode pad structure 620 are electrically connected to a first-type semiconductor layer and a second-type semiconductor layer respectively, the area of one electrode pad structure 620 can be the same as or different from the area of another electrode pad structure 620, and the shape of one electrode pad structure 620 can be the same as or different from the shape of another electrode pad structure 620. Therefore, only the eutectic layers 622 are shown in FIG. 6A. In some embodiments, each of the electrode pad structures 620 can further include the barrier layer in FIG. 1A, the adhesive layer 228 in FIG. 2 or both.

Figure 7A:
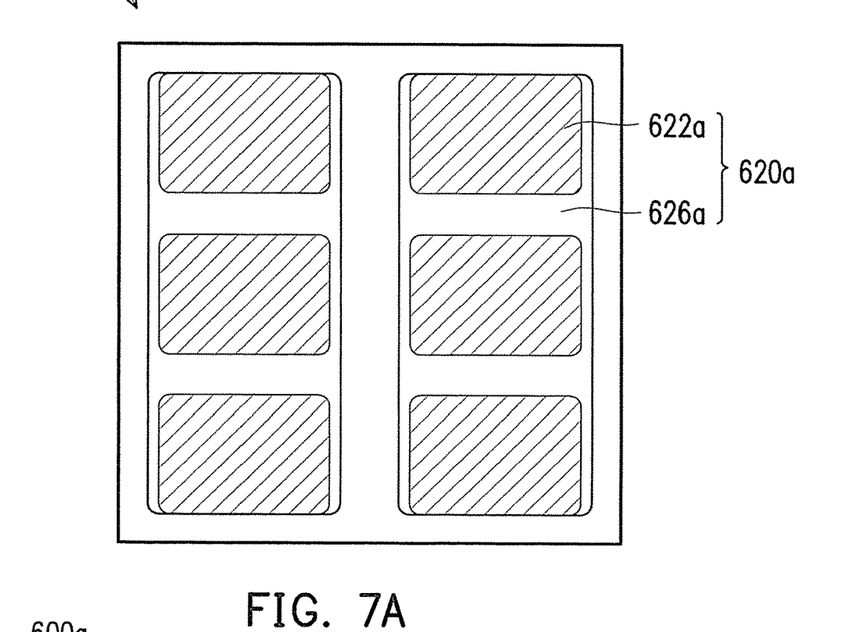
FIG. 7A is a schematic top view of an electrode pad structure of a light emitting diode according to an embodiment of the present invention.
Figure 7B:
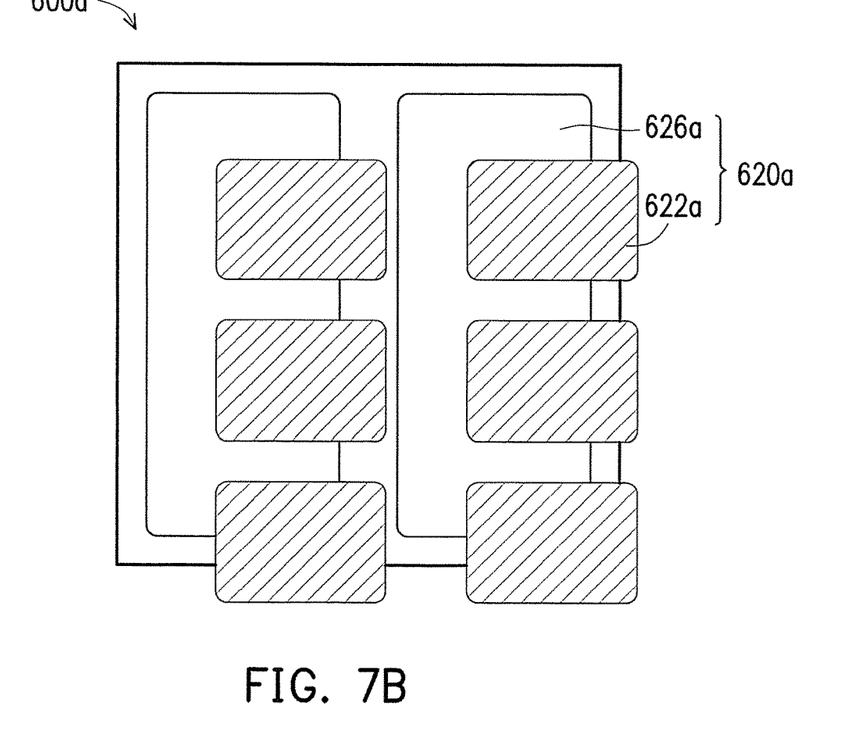
FIG. 7B is a schematic exploded view of a ductility layer and a eutectic layer of the electrode pad structure in FIG. 7A.

FIG. 7A is a schematic top view of an electrode pad structure of a light emitting diode according to an embodiment of the present invention. FIG. 7B is a schematic exploded view of a ductility layer and a eutectic layer of the electrode pad structure in FIG. 7A. Referring to FIG. 7A and FIG. 7B, in this embodiment, a light emitting diode 600a is similar to the light emitting diode 600 in FIG. 6A, and elements and functions thereof can refer to the associated description of the light emitting diode 600 in FIG. 6A. The difference between the light emitting diode 600a and the light emitting diode 600 lies in that, in each electrode pad structure 620a of the light emitting diode 600a, the total area of the eutectic layers 622a is less than the total area of the ductility layers 626a, and at least one block or three blocks for eutectic layers 622a are disposed on a single ductility layer 626a. Specifically, the blocks for the eutectic layers 622a have the same or different areas or shapes, and the blocks for the eutectic layers 622a are disposed on the corresponding ductility layer 626a. The eutectic layers 622a are electrically connected to semiconductor epitaxial structure through the ductility layers 626a.

Figure 8A:
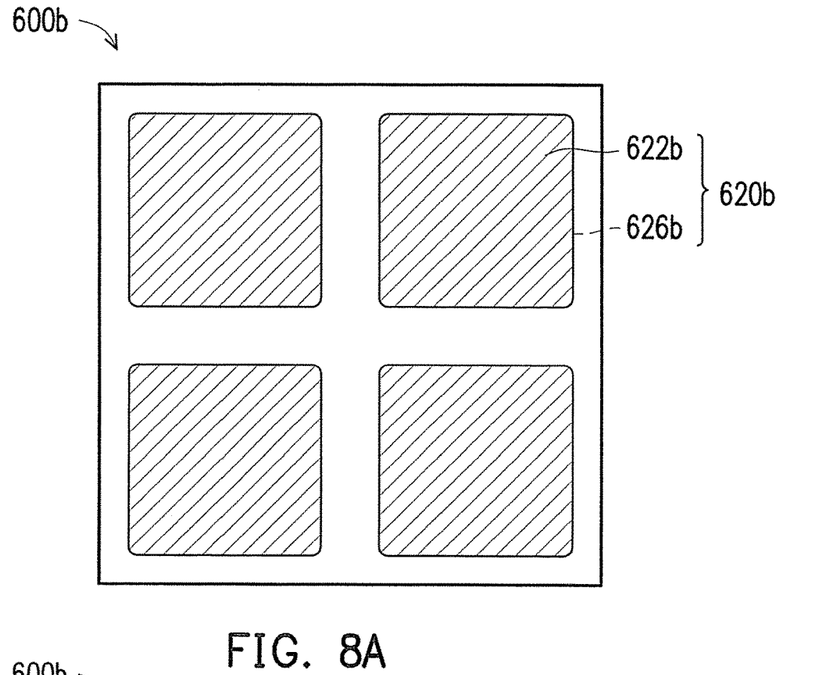
FIG. 8A is a schematic top view of an electrode pad structure of a light emitting diode according to an embodiment of the present invention.
Figure 8B:
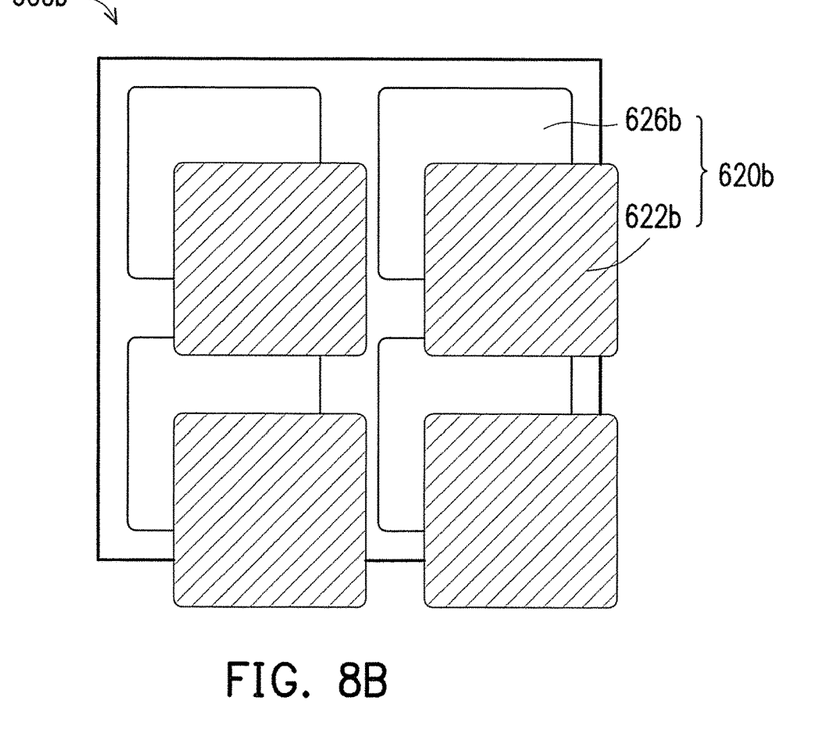
FIG. 8B is a schematic exploded view of a ductility layer and a eutectic layer of the electrode pad structure in FIG. 8A.

FIG. 8A is a schematic top view of an electrode pad structure of a light emitting diode according to an embodiment of the present invention. FIG. 8B is a schematic exploded view of a ductility layer and a eutectic layer of the electrode pad structure in FIG. 8A. Referring to FIG. 8A and FIG. 8B, in this embodiment, a light emitting diode 600b is similar to the light emitting diode 600 in FIG. 6A, and elements and functions thereof can refer to the associated description of the light emitting diode 600 in FIG. 6A. The difference between the light emitting diode 600b and the light emitting diode 600 lies in that, the light emitting diode 600b has four electrode pad structures 620b. Besides, the area and shape of each ductility layer 626b is the same as the area and shape of the corresponding eutectic layer 622b of the electrode pad structures 620b. Therefore, only the eutectic layers 622b are shown in FIG. 8A.

Figure 9A:
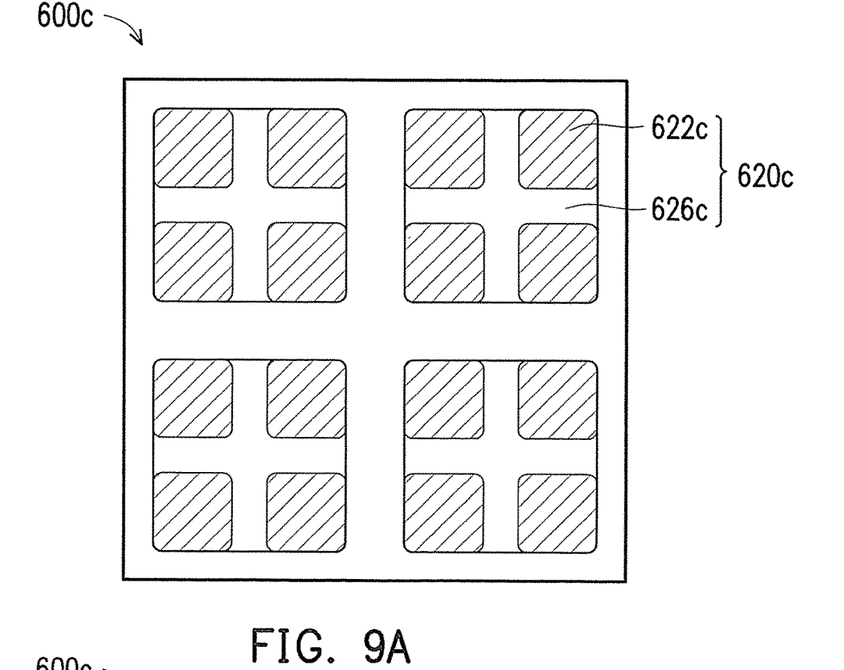
FIG. 9A is a schematic top view of an electrode pad structure of a light emitting diode according to an embodiment of the present invention.
Figure 9B:
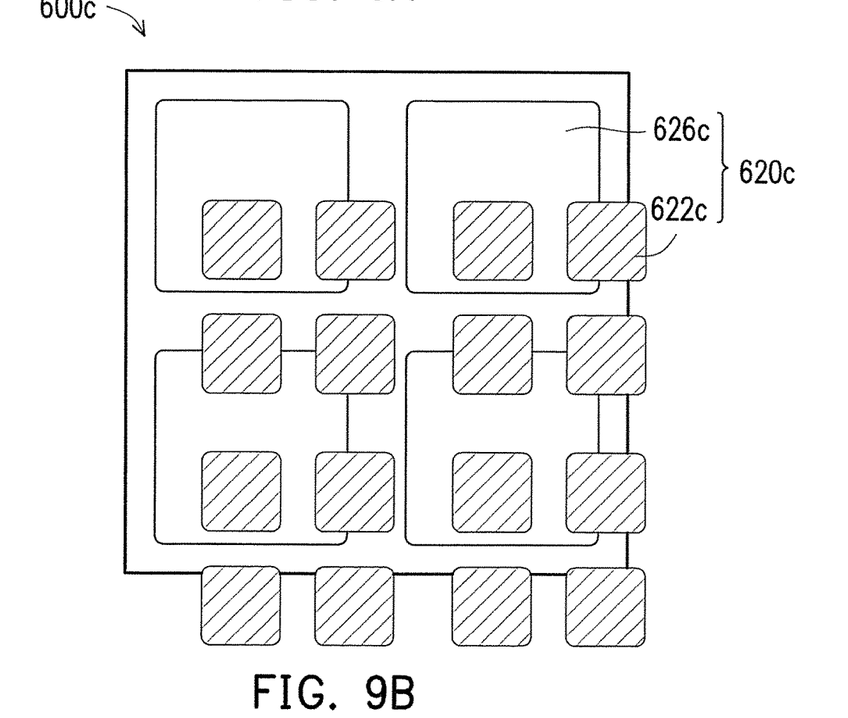
FIG. 9B is a schematic exploded view of a ductility layer and a eutectic layer of the electrode pad structure in FIG. 9A.

FIG. 9A is a schematic top view of an electrode pad structure of a light emitting diode according to an embodiment of the present invention. FIG. 9B is a schematic exploded view of a ductility layer and a eutectic layer of the electrode pad structure in FIG. 9A. Referring to FIG. 9A and FIG. 9B, in this embodiment, a light emitting diode 600c is similar to the light emitting diode 600b in FIG. 8A, and elements and functions thereof can refer to the associated descriptions of the light emitting diode 600b in FIG. 8A. The difference between the light emitting diode 600c and the light emitting diode 600b lies in that, in each electrode pad structure 620c of the light emitting diode 600c, a eutectic layer 622c is divided into four blocks disposed at four corners of the same ductility layer 626c. Besides, the total area of the eutectic layers 622a is less than the total area of the ductility layers 626a.

It is noted that, the schematic views of the light emitting diodes in figures are merely some embodiments of the present invention, and are not construed as limiting the present invention. The disposition, location, area, shape or the like of the electrode pad structure(s) of the light emitting diode of the present invention can be adjusted according to different chip designs or circuit designs. Besides, another material layer such as a barrier layer can be added to the light emitting diode upon different design requirements.

In summary, in the light emitting diode according to an embodiment of the present invention, a ductility layer is disposed in an electrode pad structure so as to relax the stress caused by the temperature change in the bonding step. Therefore, cracks caused by thermal expansion and contraction of the substrate are unlikely to occur inside the light emitting diode according to an embodiment of the present invention. In other words, the light emitting diode according to an embodiment of the present invention can be provided with the desired quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A light emitting diode, configured to be mounted to a connecting element of an external carrier substrate, the light emitting diode comprising:
  a semiconductor epitaxial structure comprising a first semiconductor layer, a second semiconductor layer and a light emitting layer disposed therebetween, wherein a portion of the first semiconductor layer is exposed by the second semiconductor layer and the light emitting layer;
  a current blocking layer disposed on the second semiconductor layer;
  a current dispersing layer covering the current blocking layer and in contact with the second semiconductor layer;
  a first metal layer disposed on the exposed first semiconductor layer;
  a second metal layer disposed on the current dispersing layer and aligned with the current blocking layer;
  a distributed Bragg reflector (DBR) layer disposed over the semiconductor epitaxial structure, wherein the DBR layer comprises at least one first opening to expose the first metal layer and a plurality of second openings to expose the second metal layer;
  a first electrode pad structure disposed on a top surface of the DBR layer and filled into the at least one first opening; and
  a second electrode pad structure disposed on the top surface of the DBR layer and filled into the second openings, wherein at least one of the first electrode pad structure and the second electrode pad structure comprises:
    a ductility layer, comprising gold and disposed upon the top surface of the DBR layer and filled into one of the at least one first opening and the second openings;
    a eutectic layer for soldering with the connecting element of the external carrier substrate, the eutectic layer being disposed on the ductility layer; and
    a barrier layer for blocking diffusion of material of the eutectic layer, disposed between the ductility layer and the eutectic layer,
    wherein the eutectic layer is disposed within a region of the ductility layer, and a total area of the eutectic layer is less than a total area of the ductility layer.
2. The light emitting diode of claim 1, wherein the eutectic layer comprises at least one material selected from the group consisting of Au, Au/Sn and Sn/Ag/Cu.
3. The light emitting diode of claim 1, wherein the barrier layer comprises at least one material selected from the group consisting of Ni, Ti and Pt.
4. The light emitting diode of claim 1, wherein the ductility layer further comprises at least one material selected from the group consisting of Al, Ni, Ti, Cr and Pt.
5. The light emitting diode of claim 1, further comprising an adhesive layer disposed between the ductility layer and one of the first metal layer and the second metal layer.
6. The light emitting diode of claim 1, wherein the eutectic layer is divided into a plurality of blocks separately disposed on the ductility layer.
7. A light emitting diode, configured to be mounted to a connecting element of an external carrier substrate, the light emitting diode comprising:
  a semiconductor epitaxial structure;
  an insulating layer disposed over the semiconductor epitaxial structure, wherein the insulating layer comprises at least one opening to expose the semiconductor epitaxial structure; and at least one electrode pad structure disposed on a top surface of the insulating layer and filled into the at least one opening, wherein the semiconductor epitaxial structure is electrically connected to the at least one electrode pad structure, and the at least one electrode pad structure comprises:
- a ductility layer, comprising gold and disposed upon the top surface of the insulating layer and filled into the at least one opening;
- a eutectic layer for soldering with the connecting element of the external carrier substrate, the eutectic layer being disposed on the ductility layer; and
- a barrier layer for blocking diffusion of material of the eutectic layer, disposed between the ductility layer and the eutectic layer,
- wherein the eutectic layer is disposed within a region of the ductility layer, and a total area of the eutectic layer is less than a total area of the ductility layer.

8. The light emitting diode of claim 7, wherein the eutectic layer comprises at least one material selected from the group consisting of Au, Au/Sn and Sn/Ag/Cu.

9. The light emitting diode of claim 7, wherein the barrier layer comprises at least one material selected from the group consisting of Ni, Ti and Pt.

10. The light emitting diode of claim 7, wherein the ductility layer further comprises at least one material selected from the group consisting of Al, Ni, Ti, Cr and Pt.

11. The light emitting diode of claim 7, further comprising an adhesive layer disposed between the ductility layer and the semiconductor epitaxial structure.

12. The light emitting diode of claim 11, wherein the adhesive layer comprises at least one material selected from the group consisting of Ni, Ti, Cr and Pt.

13. The light emitting diode of claim 7, wherein the at least one electrode pad structure comprises a first electrode pad structure and a second electrode pad structure separated from each other.

14. The light emitting diode of claim 7, wherein the eutectic layer is divided into a plurality of blocks separately disposed on the ductility layer.

15. A light emitting diode, configured to be mounted to a connecting element of an external carrier substrate, the light emitting diode comprising:
- a semiconductor epitaxial structure;
- an insulating layer disposed over the semiconductor epitaxial structure, wherein the insulating layer comprises at least one opening to expose the semiconductor epitaxial structure; and
- at least one electrode pad structure disposed on a top surface of the insulating layer and filled into the at least one opening, wherein the semiconductor epitaxial structure is electrically connected to the at least one electrode pad structure, and the at least one electrode pad structure comprises:
  - a ductility layer, comprising gold and disposed upon the top surface of the insulating layer and filled into the at least one opening; and
  - a eutectic layer for soldering with the connecting element of the external carrier substrate, the eutectic layer being disposed on the ductility layer;
  - wherein the eutectic layer is disposed within a region of the ductility layer and a material of the ductility layer is different from a material of the eutectic layer,
  - wherein a total area of the eutectic layer is less than a total area of the ductility layer.

16. The light emitting diode of claim 15, wherein the eutectic layer comprises at least one material selected from the group consisting of Au, Au/Sn and Sn/Ag/Cu.

17. The light emitting diode of claim 15, wherein the ductility layer comprises at least one material selected from the group consisting of Al, Ni, Ti, Cr and Pt.

18. The light emitting diode of claim 15, further comprising an adhesive layer formed between the ductility layer and the semiconductor epitaxial structure.

19. The light emitting diode of claim 18, wherein the adhesive layer comprises at least one material selected from the group consisting of Ni, Ti, Cr and Pt.

20. The light emitting diode of claim 15, wherein the eutectic layer is divided into a plurality of blocks separately disposed on the ductility layer.

* * * * *